(12) United States Patent
Riou et al.

(10) Patent No.: US 8,507,332 B2
(45) Date of Patent: Aug. 13, 2013

(54) METHOD FOR MANUFACTURING COMPONENTS

(75) Inventors: Gregory Riou, Crolles (FR); Didier Landru, Champ Pres Froges (FR)

(73) Assignee: Soitec, Bernin (FR)

( * ) Notice: Subject to any disclaimer, the term of this patent is extended or adjusted under 35 U.S.C. 154(b) by 151 days.

(21) Appl. No.: 13/143,170

(22) PCT Filed: Feb. 11, 2010

(86) PCT No.: PCT/EP2010/051701
§ 371 (c)(1),
(2), (4) Date: Jul. 1, 2011

(87) PCT Pub. No.: WO2010/097294
PCT Pub. Date: Sep. 2, 2010

(65) Prior Publication Data
US 2011/0266651 A1   Nov. 3, 2011

(30) Foreign Application Priority Data
Feb. 24, 2009   (FR) ..................... 09 51156

(51) Int. Cl.
*H01L 21/762* (2006.01)
*H01L 27/04* (2006.01)
(52) U.S. Cl.
USPC ........... 438/152; 438/282; 438/404; 438/412; 257/522; 257/E21.546; 257/E27.01
(58) Field of Classification Search
USPC ........... 438/152, 282, 412; 257/522, E27.01, 257/E21.546
See application file for complete search history.

(56) References Cited

U.S. PATENT DOCUMENTS

| 6,211,039 B1 * | 4/2001 | Noble ........................... 438/412 |
| 6,300,218 B1 | 10/2001 | Cohen et al. |
| 7,229,877 B2 | 6/2007 | Cheng et al. |
| 7,939,387 B2 * | 5/2011 | Kononchuk ................. 438/152 |
| 2006/0270121 A1 | 11/2006 | Ipposhi et al. |

FOREIGN PATENT DOCUMENTS

| JP | 2006049725 A | 2/2006 |
| KR | 1020070084317 A | 8/2007 |
| WO | 2008114099 A | 9/2008 |

OTHER PUBLICATIONS

International Search Report for International Application No. PCT/EP2010/051701 mailed Mar. 3, 2010, 3 pages.
International Preliminary Report on Patentability and Written Opinion for International Application No. PCT/EP2010/051701 dated Aug. 30, 2011, 6 pages.

(Continued)

*Primary Examiner* — Angel Roman
(74) *Attorney, Agent, or Firm* — TraskBritt

(57) ABSTRACT

A method for manufacturing components on a mixed substrate. The method comprises the following steps: providing a substrate of the semiconductor-on-insulator (SeOI) type comprising a buried oxide layer between a supporting substrate and a thin layer, forming in this substrate a plurality of trenches opening out at a free surface of the thin layer and extending over a depth such that each trench passes through the thin layer and the buried oxide layer, these primary trenches delimiting at least one island of the SeOI substrate, forming a mask inside the primary trenches and as a layer covering the areas of the free surface of the thin layer located outside the islands, proceeding with heat treatment for dissolving the buried oxide layer present at the island, so as to reduce the thickness thereof.

24 Claims, 4 Drawing Sheets

(56) References Cited

OTHER PUBLICATIONS

Kononchuk et al., Internal Dissolution of Buried Oxide in SOI Wafers, Solid State Phenomena, vols. 131-133 (2008) pp. 113-118.

Ludsteck et al., Growth Model for Thin Oxides and Oxide Optimization, Journal of Applied Physics, vol. 95, No. 5, Mar. 1, 2004, pp. 2827-2831.

\* cited by examiner

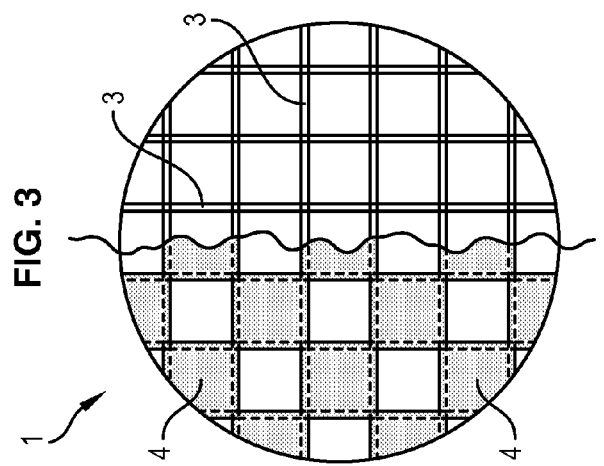
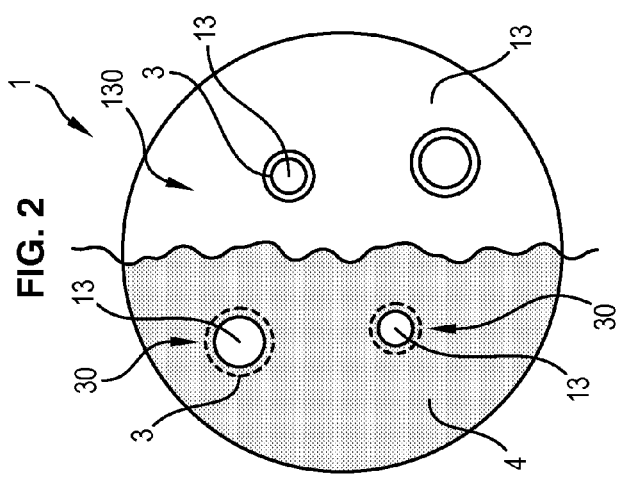
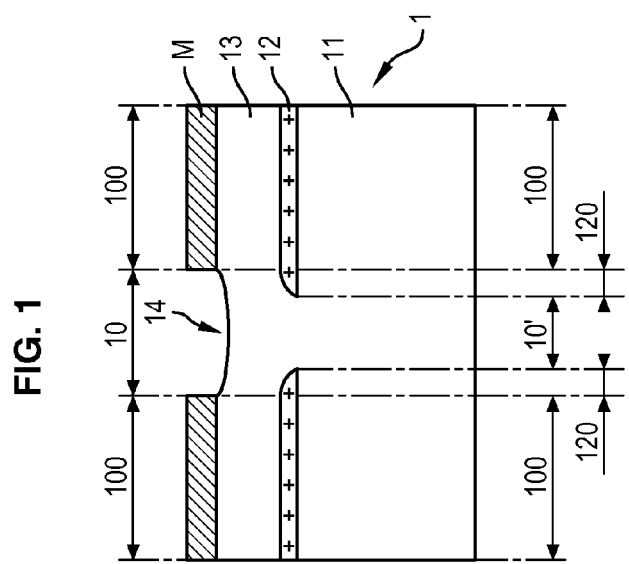

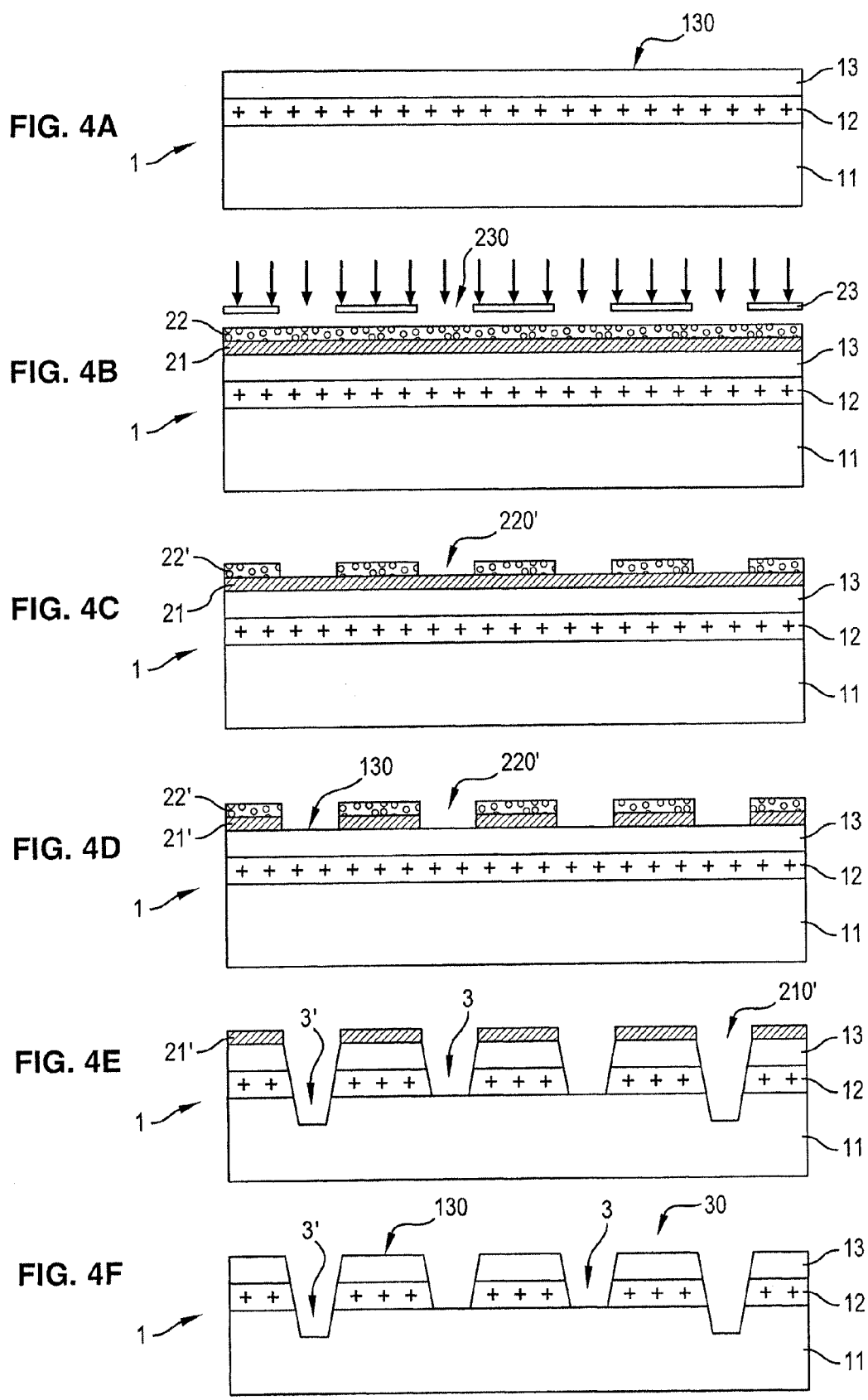

US 8,507,332 B2

METHOD FOR MANUFACTURING COMPONENTS

CROSS-REFERENCE TO RELATED APPLICATIONS

This is a national phase entry under 35 U.S.C. §371 of International Patent Application PCT/EP2010/051701, filed Feb. 11, 2010, published in English as International Patent Publication WO 2010/097294 A1 on Sep. 2, 2010, which claims the benefit under Article 8 of the Patent Cooperation Treaty to French Patent Application Serial No. 0951156, filed Feb. 24, 2009, the entire disclosure of which is hereby incorporated herein by this reference.

TECHNICAL FIELD

The present invention relates to a method for manufacturing components for electronics, optics and/or optoelectronics on a so-called "mixed" substrate, i.e., a substrate that either comprises a layer of insulating material having areas of different thicknesses, or distinct layer portions in an insulating material, buried within a substrate in semiconducting material.

BACKGROUND

Mixed substrates today are of increasing interest.

By alternating bulk areas and insulating areas that may have variable insulator thicknesses, within the same substrate, different components may be made on the same and single substrate plate, such as, for example:

on bulk areas: components having an electric connection between the front and rear faces of the substrate, for example, so-called "vertical" components, on areas of the "SeOI" ("Semiconductor-On-Insulator") type or further of the "SOI" ("Silicon-On-Insulator") type, components totally isolated from each other and isolated from their substrate, for example, components of the "MOS" type or systems of the "MEMS" or "MOEMS" type, and on SeOI areas having a very thin insulator layer, with a thickness of less than 10 nm, other types of logic MOS components, which have, under the insulator layer, a ground plane or a rear gate, for example.

The acronym "MOS" corresponds to "Metal-Oxide Semiconductor." The acronyms "MEMS" and "MOEMS," respectively, correspond to "Micro-Electro-Mechanical Systems," and "Micro-Opto-Electro-Mechanical Systems."

Many techniques manufacturing mixed substrates already exist.

Among the latter, mention may be made of the technique of total or partial selective (i.e., localized) dissolution of the oxide of a semiconductor-on-insulator (SeOI) type structure. Such a structure successively comprises from its base toward its surface: a supporting substrate in a semiconducting material, an oxide layer and a thin semiconducting layer.

This selective dissolution method is described briefly below. It comprises the following steps:

(a) forming a mask on the thin semiconducting layer, so as to define at the surface of the latter, so-called "exposed" areas, not covered by the mask, distributed according to a desired pattern, (b) applying a heat treatment in a controlled reducing or neutral atmosphere, and under controlled temperature and duration conditions, so as to incite the oxygen present in the oxide layer of the exposed areas to diffuse through the thin semiconducting layer, leading to partial or total disappearance of the oxide buried in these areas, according to the desired pattern.

FIG. 1 is a diagram illustrating an exemplary mixed substrate thereby obtained, after selective and total dissolution of the oxide and before removal of the mask having allowed this localized dissolution.

In FIG. 1, an SeOI substrate 1 may be seen comprising a supporting substrate 11 in a semiconducting material, an oxide layer 12 and a thin semiconducting layer 13. A mask bears reference M.

Taking into account the shape of the mask M, after dissolution, a mixed substrate should be theoretically obtained, comprising a bulk area referenced as 10 and an SeOI area referenced as 100 with the pattern of the SeOI area 100 essentially corresponding to the pattern of the mask M.

Now, in practice, between the actually obtained bulk area 10' and the SeOI area 100, a transition area 120 much more extended than as expected is observed, in which the oxide is only partly dissolved. This transition area 120 results from the fact that at a vertical edge of the mask M, extending in the vicinity of the exposed area of the SeOI substrate 1, dissolution of the oxide layer 12 is less well carried out.

In the case (not shown) when dissolution of the oxide is only partial, a transition area is also observed between the SeOI area and the area where the oxide has been partly dissolved.

Moreover, in the surface layer 13, located in the vicinity of this transition area, the presence of crystalline defects such as dislocations is noticed. These defects are related to the required crystalline rearrangement induced by the deformations of the layers, for example, by the collapse of the exposed thin layer 13, or further by the realignment of crystalline lattices of the surface layer and of the underlying substrate in the case when the buried oxide layer is entirely dissolved. The collapsed portion of the layer 13 bears reference 14 (see FIG. 1).

DISCLOSURE

The aforementioned defects are not desirable and the object of the invention is to find a remedy for them and to protect against the formation of this area of crystalline defects in the vicinity of the transition area.

Further, it would be desirable to minimize as much as possible the width of the transition area 120, in order to obtain bulk areas 10 and SeOI areas 100, or else SeOI areas 100 and areas with a partly dissolved oxide layer, clearly distinct from each other, i.e., with a sharp transition between these areas.

For this purpose, the invention relates to a method for manufacturing components for electronics, optics and/or optoelectronics on a so-called "mixed" substrate, which comprises first semiconductor-on-insulator areas, in which an oxide layer is buried between two layers of semiconducting material, and either areas in a semiconducting material, so-called "bulk" areas, or second semiconductor-on-insulator areas in which the buried oxide layer is less thick than that of the first areas, this process consisting of providing a substrate of the semiconductor-on-insulator (SeOI) type comprising a supporting substrate in a semiconducting material, a thin semiconducting layer and a buried oxide layer between the supporting substrate and the thin layer.

According to the invention, this method comprises the following successive steps:

forming in this substrate a plurality of trenches, so-called "primary trenches," opening out at the free surface of the thin layer, each primary trench extending over a depth such that each primary trench passes through the thin layer and the buried oxide layer, these primary trenches being formed so as to delimit and surround at least one so-called "island" area of the SeOI substrate, forming a mask, a so-called "dissolution" mask, by depositing a material forming the mask inside the primary trenches and in the form of a layer covering the areas of the free surface of the thin layer located on the outside of the islands, proceeding with heat treatment for dissolving the buried oxide layer present at the islands of the SeOI substrate, so as to reduce the thickness thereof.

According to other advantageous and non-limiting characteristics of the invention, either taken alone or as a combination:

- after the dissolution heat treatment, the totality of the dissolution mask is removed;
- after removal of the dissolution mask, an insulating material is deposited in the primary trenches during the manufacturing of components for electronics, optics and/or optoelectronics;
- the dissolution heat treatment is continued until total dissolution of the oxide at the islands;
- each primary trench is formed so as to pass through the thin semiconducting layer and the buried oxide layer and to extend over a portion of the thickness of the supporting substrate in semiconducting material located under the buried oxide layer;
- the dissolution mask is formed so as to also comprise a portion that covers the outer periphery of the islands in the extension of the area located above the primary trench surrounding the island;
- the dissolution mask is made in silicon nitride $Si_xN_y$ or in silicon carbide SiC;
- the primary trenches are formed by photolithography and etching;
- the dissolution heat treatment is conducted inside an oven in which a neutral or reducing atmosphere prevails and where the oxygen content is less than 10 ppm, and at a temperature comprised between 1,100° C. and 1,300° C.;
- the semiconducting material is silicon;
- after the dissolution heat treatment, only the portion of the mask present as a layer covering the areas of the free surface of the thin layer located outside the islands, is removed, and the portion of the mask present in the primary trenches is retained;
- the islands have a surface area comprised between 4 and 100 μm².

Other characteristics and advantages of the invention will become apparent from the description that will now be made of it, with reference to the appended drawings, which illustrate as an indication but not as a limitation, several possible embodiments thereof.

BRIEF DESCRIPTION OF THE DRAWINGS

In these drawings:

FIG. 1 is a diagram illustrating a mixed substrate, covered with a mask, obtained according to a method of the state of the art;

FIGS. 2 and 3 are diagrams illustrating in a top view, two alternative embodiments of the step for forming trenches and masking a substrate of the method of the invention;

FIGS. 4A-4F are diagrams illustrating an embodiment of different steps of the method according to the invention leading to the formation of trenches in a semiconductor-on-insulator substrate;

DETAILED DESCRIPTION OF THE INVENTION

Figure 5A:
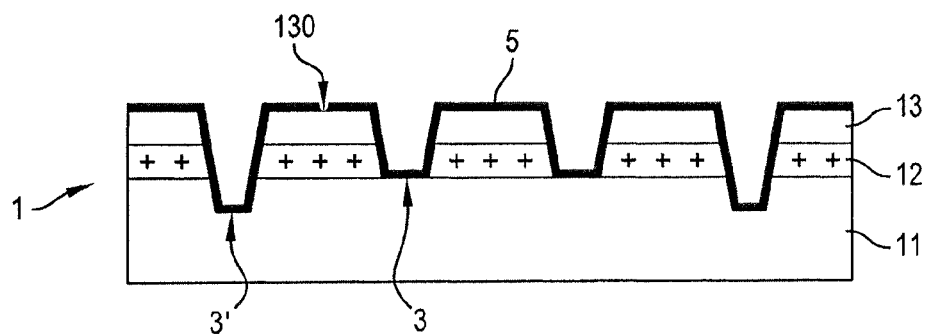
FIGS. 5A-5F are diagrams illustrating different steps of a first embodiment of the method according to the invention leading to the formation of a mixed substrate with a view to its use in the manufacturing of components.

A first portion of the method according to the invention consists of making trenches inside a substrate of the semiconductor-on-insulator type, called in the following of the description, a "SeOI substrate," before proceeding with the steps for selective, partial, or total dissolution of the insulator layer that is buried therein. The purpose is, thus, to crystallographically isolate the areas of the substrate in which the buried oxide will be dissolved from the areas in which the oxide will be preserved. The extension of the transition area and the generation of crystalline defects in the vicinity of this transition area are thereby limited.

To do this, it is necessary to make a mask at the surface of the SeOI substrate, a mask, the pattern of which corresponds to that of the trenches to be formed.

The different steps of a possible embodiment of this mask, called a "mask for forming trenches" hereafter, will now be described with reference to FIGS. 4A-4D.

In FIG. 4A, an SeOI substrate 1 may be seen, successively comprising from its base to its surface a semiconducting supporting substrate 11, an oxide layer 12, and a thin semiconducting layer 13. The free upper face of the layer 13 is referenced as 130.

The oxide layer 12 is buried between the supporting substrate 11 and the semiconducting layer 13; it is, therefore, generally designated in the language of the art by the acronym of BOX (Buried Oxide layer).

As an example, the supporting substrate 11 essentially plays a stiffener role for the SeOI substrate 1.

For this purpose, it typically has a thickness of the order of a few hundred micrometers.

The supporting substrate 11 may be a bulk substrate or else a composite substrate, i.e., consisting of a stack of at least two layers of different materials.

As an example, the supporting substrate 11 may thus comprise one of the following materials: silicon (Si), gallium nitride (GaN), sapphire, in their monocrystalline or polycrystalline forms.

The thin semiconducting layer 13 may possibly be a composite, i.e., consisting of a stack of layers of semiconducting materials.

The material of the thin semiconducting layer 13 may be monocrystalline, polycrystalline, or amorphous. It may either be porous or not, either doped or not.

The thin semiconducting layer 13 comprises at least one semiconducting material, for example, silicon (Si), germanium (Ge) or silicon-germanium (SiGe). It may be formed by a relaxed or stressed material.

According to a preferred alternative of the invention, the SeOI substrate 1 is an SOI substrate in which the semiconducting material of the support 11 and of the thin layer 13 is silicon.

In order to allow sufficiently rapid diffusion of oxygen later on, the thin semiconducting layer 13 preferably has a thickness of less than 500 nm, still preferably less than 250 nm or better even less than 70 nm. Indeed, the thicker the semiconducting layer 13, the slower the dissolution rate of the oxide 12.

Thus, diffusion of oxygen through a semiconducting layer 13 with a thickness of more than 500 nm is very slow and consequently not very advantageous industrially.

In order to limit the duration of the dissolution treatment, the oxide layer 12 of the SeOI support preferably has a thin or ultra-thin thickness, i.e., comprised between 5 nm and 100 nm, preferably between 10 nm and 25 nm.

The SeOI substrate 1 used in the method according to the invention is made by any technique for transferring layers, as known to one skilled in the art, involving adhesive bonding.

Among these techniques, mention may be made of the SMARTCUT™ method that, as a reminder, mainly comprises the following steps:

i) forming an oxide layer on the supporting substrate or on a donor substrate comprising the semiconducting layer,
 ii) forming an embrittlement area in the donor substrate, the embrittlement area defining the thin semiconducting layer to be transferred,
 iii) adhesively bonding the donor substrate on the supporting substrate, the oxide layer being located at the adhesive bond interface,
 iv) fracturing the donor substrate along the embrittlement area in order to transfer the thin semiconducting layer onto the supporting substrate.

This method is known to one skilled in the art and will not, therefore, be described in detail here. Reference may be, for example, made to "*Silicon-on-Insulator Technology: Materials to VLSI, 2$^{nd}$ Edition* of Jean-Pierre Colinge, Kluwer Academic Publishers, pp. 50-51.

A method may also be used consisting of adhesively bonding on the supporting substrate, a donor substrate comprising the semiconducting layer, either one or both of the substrates being covered with an oxide layer, and of then reducing the thickness of the donor substrate through its rear face, so as to only leave on the supporting substrate the thin semiconducting layer.

The thereby obtained SeOI substrate may then be subject to standard finishing treatments (polishing, planarization, cleaning, etc.).

In these methods for forming the SeOI substrate, the oxide layer is formed on the donor substrate or on the supporting substrate by heat oxidation (in which case the oxide is an oxide of the material of the substrate having been subject to oxidation) or else by a deposit, for example, of silicon oxide ($SiO_2$).

The oxide layer may also be a layer of native oxide, resulting from natural oxidation of the donor substrate and/or of the supporting substrate in contact with the atmosphere.

It is specified that before proceeding with adhesive bonding, it is possible to apply on either one or both of the surfaces in contact, steps for cleaning or plasma activation well-known to one skilled in the art, in order to strengthen the adhesive bonding energy.

As this may be seen in FIG. 4B, a layer 21, of a material capable of forming a hard mask is optionally preferably formed by deposition on the SeOI substrate 1. This material is capable of withstanding the subsequent conditions of an etching treatment.

As an example, silicon oxide is a preferred material for forming this hard mask, since it is easy to apply, i.e., easy to deposit and to then remove. Further, in the case when the semiconducting material of the thin layer 13 is silicon, the use of $SiO_2$ is wise since it does not contaminate it and is selectively etched with regard to silicon.

The layer 21 has a thickness of the order of 20 nm.

A photosensitive resin layer 22 is then deposited over the whole surface of the layer 21, if the latter exists, or otherwise directly on the substrate 1.

A photolithographic mask 23, the pattern of which corresponds to that of the trenches that one wishes to form subsequently on the SeOI substrate 1, is applied on the assembly. In other words, the apertures 230 of the photolithographic mask 23 correspond to the location of the future trenches.

It is proceeded with local insolation of the resin 22, through the mask 23.

As illustrated in FIG. 4C, the insolated areas of the resin 22 are selectively removed, for example, by dissolution in a solvent, so as to obtain a resin layer 22' having apertures 220', the patterns of which correspond to those of the apertures 230 of the mask 23.

As illustrated in FIG. 4D, it is then proceeded with etching, through the apertures 220' formed in the resin layer 22', of the exposed areas of the hard mask layer 21, if the latter was formed beforehand. Typically, this etching is dry etching, carried out with plasma, to which the resin layer 22' is resistant. The residual resin layer 22' is then removed, for example, by means of a suitable solvent. The mask 21', called the "etching mask" hereafter, is thereby obtained.

Alternatively, in particular when the step for forming the hard mask layer 21 has been omitted, the resin 22' may be preserved and it may be directly proceeded with the subsequent steps for forming trenches.

The technique described above is current in the field of microelectronics and is only indicated as an example. Generally, any method with which the etching mask 21' may be formed or with which deep trenches may be formed may be used at this stage of the method.

As this may be seen in FIG. 4E, it is then proceeded with etching through the apertures 210' made in the mask 21' and/or the apertures 220' made in the resin 22', of the exposed areas of the SeOI substrate 1, so as to form trenches therein.

These trenches are formed by dry etching, for example, in particular, according to the known technique of "Deep Reactive Ion Etching."

According to a first embodiment, the trench is etched until it extends down to a depth at which it passes through the thin layer 13 and the buried oxide layer 12. In this case, the trench bears the numerical reference 3.

According to a second alternative embodiment, this trench 3 is etched a little deeper so that it extends over a portion of the thickness of the supporting substrate 11, for example, over several micrometers. This trench then bears numerical reference 3'.

In the figures, these trenches 3, 3' are illustrated with a flared shape; they may, however, have parallel vertical walls.

The width of the trenches 3, 3' is typically of the order of a few hundred nanometers.

In FIG. 4E and the following figures and for purposes of simplification, both types of trench 3 and 3' have been illustrated on a same substrate.

The hard mask residue 21' (if it exists) is then removed, for example, by dry or wet etching, so as to obtain the SeOI substrate 1 provided with its trenches 3 or 3', as illustrated in FIG. 4F.

The purpose of forming these trenches 3, 3' is to delimit by surrounding each trench 3, 3' with at least one area of the SeOI substrate 1, which comprises at least one portion of the thin layer 13 and one portion of the oxide layer 12, or even one portion of the supporting substrate 11, so as to separate it from the area located around it. Such an area is hereafter designated as "island" and it is in this area that the total or partial dissolution of the oxide will take place subsequently. The islands bear reference 30.

By referring to FIG. 2, an exemplary embodiment may be seen of these islands of circular shape.

Although such a shape or any other irregular island shape is possible, the islands will preferably be defined by a first series of parallel trenches and a second series of trenches perpendicular to the first, as illustrated in FIG. 3. A grid of the SeOI substrate 1 is thereby obtained. The islands may have a surface area comprised between 4 and 100 $\mu m^2$. The arrangement and the dimensions of the islands 30 are dictated by the components that will be formed on the plate.

A first alternative embodiment of the step for dissolving the oxide will now be described with reference to FIGS. 6A-6C.

Figure 6A:
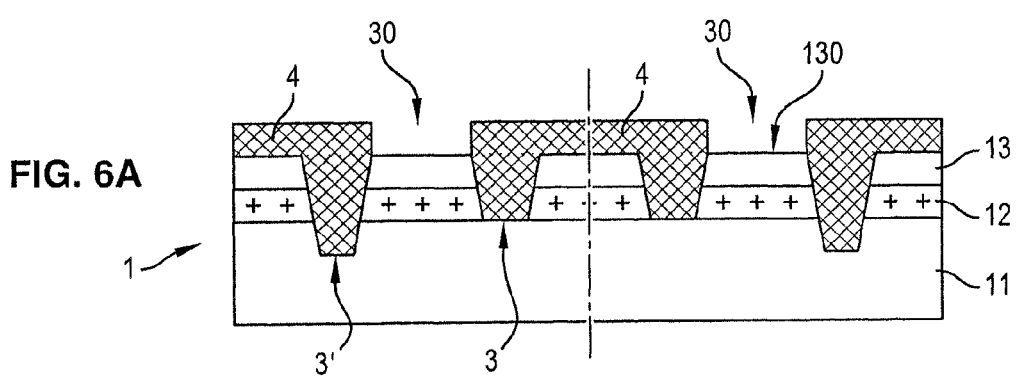
FIGS. 6A-6C are diagrams illustrating different steps of a second embodiment of the method according to the invention leading to the formation of a mixed substrate with a view to its use in the manufacturing of components.

As this may be seen in FIG. 6A, a mask 4 is formed, called a "dissolution mask" hereafter, by depositing the material making it up in the inside of the primary trenches 3, 3' on the one hand, and as a layer extending over the portions of the free surface 130 of the thin layer 13 located on the outside of the islands 30 defined earlier on the other hand.

In FIG. 2, schematically, only the mask 4 is illustrated on the left half of the substrate 1. It may be seen that it covers the free surface 130 of the substrate 1 and the trenches 3, except for the islands 30, at which dissolution will be carried out subsequently.

In the case illustrated in FIG. 3 where the trenches are rectilinear and intersect at a right angle, the mask 4 may, for example, be advantageously deposited as a checkerboard.

The material used for making the mask 4 should preferably be simultaneously: easy to deposit, and then possibly easy to remove after the dissolution treatment, and be capable of withstanding the dissolution treatment conditions and finally foaming a barrier to the diffusion of oxygen atoms.

Silicon nitride of the general formula $Si_xN_y$, where the pair of stoichiometric coefficients x and y may assume different values, is particularly well suited. $Si_3N_4$ will notably be used. It is also possible to use silicon carbide SiC.

The formation of this mask 4 is applied by using conventional photolithographic techniques, for example, the one described in connection with FIGS. 4B-4D.

The mask 4 is typically of a thickness comprised between 1 and 50 nanometers, preferably of the order of 20 nanometers.

The treatment for totally or partly dissolving the oxide 12 will now be described with reference to FIG. 6B.

This dissolution treatment consists of applying a heat treatment to the substrate 1, in a neutral or reducing atmosphere, under determined temperature and duration conditions, which notably depend on the thickness of the thin semiconducting layer 13.

The application of the dissolution treatment to a substrate 1 will be taken as an example hereafter, in which the thin semiconducting layer 13 is of silicon, i.e., a "silicon-on-insulator" (SOI) substrate.

The mechanisms for dissolving the oxide in an SOI structure are described in detail in the article of O. Kononchuk et al., "*Internal Dissolution of Buried Oxide in SOI Wafers*," Solid State Phenomena Vols. 131-133 (2008) pp. 113-118, which may be referred to.

During the treatment, the SOI substrate 1 is placed in an oven in which a gas flow is generated in order to form a neutral or reducing atmosphere.

The gas flow may thus comprise argon, hydrogen and/or a mixture thereof.

It is important to note that the dissolution phenomenon only occurs when there is a sufficient gradient between the oxygen concentration in the atmosphere and the oxygen concentration at the surface of the oxide layer.

Thus, it is considered that the oxygen content of the atmosphere in the oven should be less than 10 ppm, which, when taking into account leaks, imposes an oxygen content in the gas flow of less than 1 ppb.

In this respect, reference may be made to the article of Ludsteck et al., "*Growth model for thin oxides and oxide optimization*," Journal of Applied Physics, Vol. 95, No. 5, March 2004.

These conditions cannot be obtained in a conventional oven, which generates too many leaks for being able to attain such a small content; the oven should be specially designed for an optimum seal, notably by reducing the number of parts in order to avoid gaskets and by using bulky parts.

On the contrary, an oxygen concentration in the atmosphere above 10 ppm stops dissolution and promotes oxidation of the exposed silicon.

In the case of an SOI, the dissolution treatment is applied at temperatures comprised between 1,100° C. and 1,300° C., preferably of the order of 1,200° C.

Indeed, the higher the temperature, the higher is the dissolution rate of the oxide. The temperature of the treatment should, therefore, remain below the melting temperature of silicon.

For example, in order to dissolve an oxide thickness of 2 nm under a thin 100 nm silicon layer, the heat treatment conditions are: 1,100° C. for 2 hours, 1,200° C. for 10 minutes, or 1,250° C. for 4 minutes. However, it is emphasized that these values, in particular, depend on the residual oxygen concentration in the dissolution oven. Thus, larger dissolved thicknesses have also been observed.

In any case, the dissolution treatment is applied so as to totally or partly remove the buried insulator.

Figure 6B:
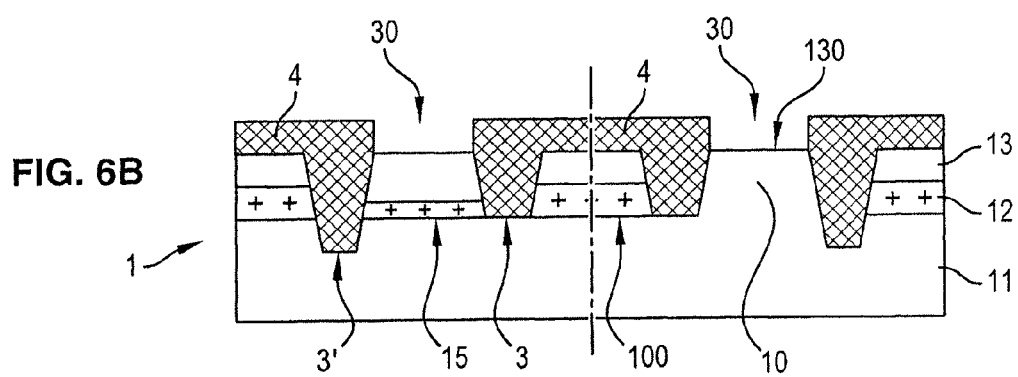
Figure 6C:
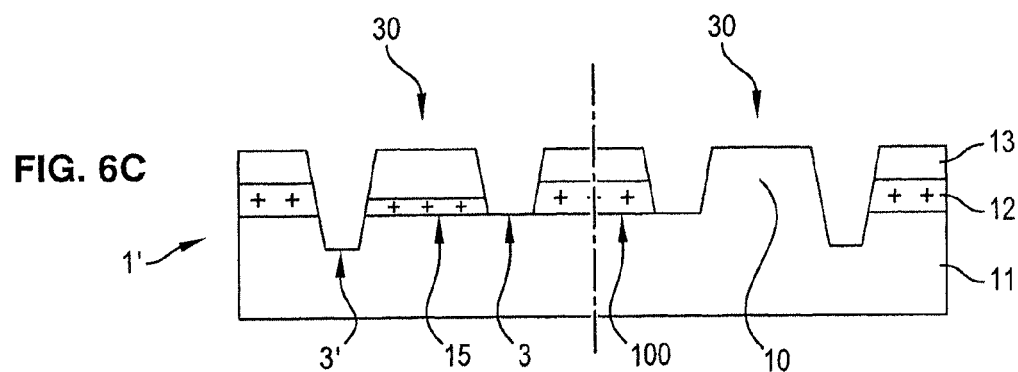

For purposes of simplification, the result obtained after partial dissolution of the oxide is illustrated on the left half of FIGS. 6B and 6C, and on the right half, the one obtained after total dissolution of the oxide. However, during application of the method, it will be noted that it is only possible to obtain on the same substrate, partial dissolution or total dissolution of the oxide.

After total or partial dissolution of the oxide 12 at the islands 30 not protected by the mask 4, the mask 4 is removed, for example, by dry or wet etching, and the mixed substrate 1' is obtained as illustrated in FIG. 6C.

It is observed that by the presence of the trenches 3, 3', the SeOI areas 100 are clearly distinct, either from the bulk areas 10 (when dissolution is total), or from the areas 15 with a thinned oxide layer (when dissolution is partial). There are no longer any transition areas, as this was the case with the techniques of the prior art, nor any areas having excessive dislocations in the thin layer.

Further, in a particularly advantageous way, the thereby formed trenches 3, 3' may be reused subsequently during the method for manufacturing electronic components for depositing an insulator thereon. Indeed, trenches are often made during the steps for manufacturing the components, for example, those known to one skilled in the art under the acronym of "STI" (Shallow Trench Isolation). The method according to the invention, therefore, does not involve any additional operation for the manufacture of components but the fact of forming these trenches earlier in the manufacturing method allows the aforementioned advantages to be obtained.

A second alternative embodiment of the dissolution treatment will now be described with reference to FIGS. 5A-5F.

Elements identical with those of the previous figures bear the same numerical references.

A thin film 5 of nitride is deposited on the upper face 130 of a substrate 1 such as the one illustrated in FIG. 4F, as well as in the bottom and on the flanks of the trenches 3, 3'. This nitride is, for example, $Si_3N_4$.

The deposition is carried out by a technique for depositing a vapor phase, known as "Vapor Phase Deposition."

Figure 5B:
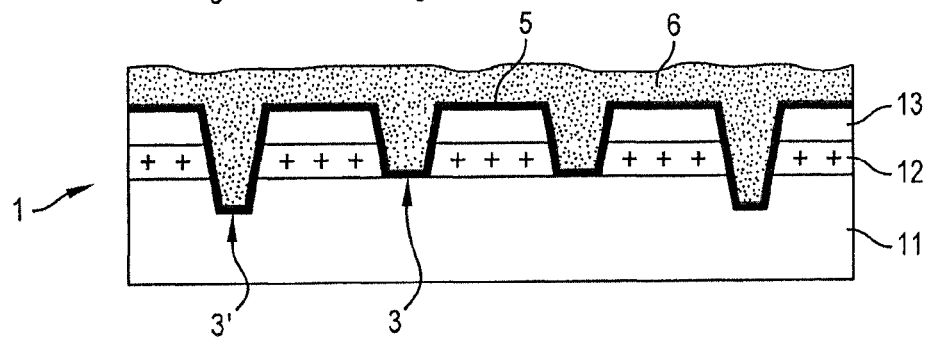

As illustrated in FIG. 5B, a thick layer of an insulator 6, such as $SiO_2$, is then deposited on the nitride layer 5 so as to fill the trenches 3, 3' and to cover the totality of the surface of the substrate 1.

Figure 5C:
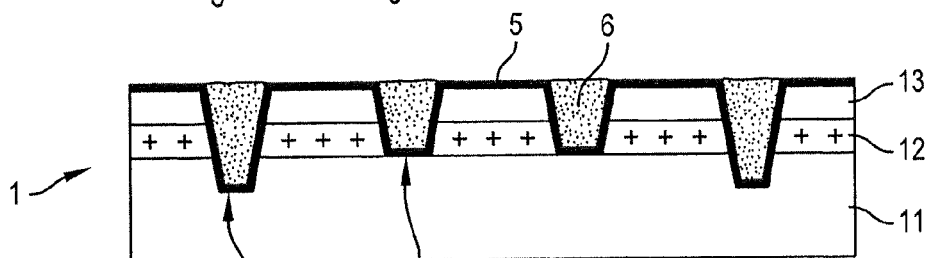

It is then proceeded with polishing of the surface of the insulating layer 6. The obtained result is illustrated in FIG. 5C. With the thin layer of nitride 5, it is possible to selectively stop removal of $SiO_2$ at the surface during the polishing, since this material is much harder than $SiO_2$.

The thin nitride layer 5 present at the surface of the layer 13 is then removed. This is typically achieved in the continuity of the previous polishing step, by changing the conditions of this polishing, for example, by introducing a suitable polishing slurry.

Figure 5D:
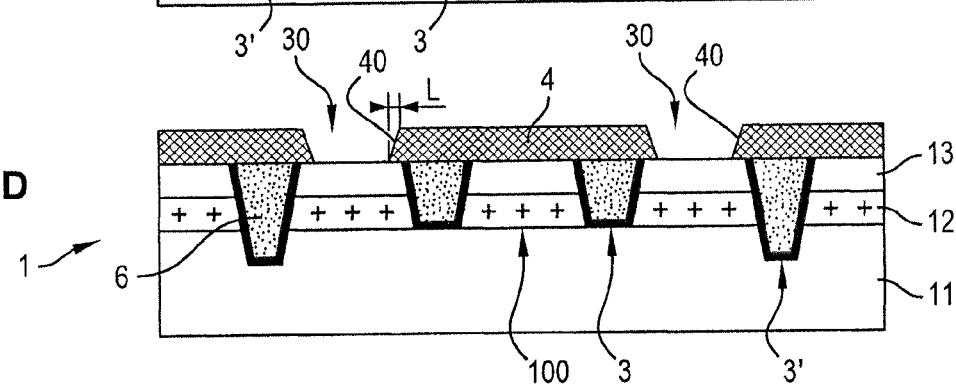

As this may be seen in FIG. 5D, the dissolution mask 4 is deposited at the surface of the substrate, according to what has been described earlier for the embodiment described together with FIGS. 6A-6C. The nature of this mask and the techniques of its deposition will, therefore, not be described in detail again.

However, it will be noted that in this case, the mask 4 may advantageously be deposited so as to also cover the outer periphery of an island 30, over a width L, in the extension of the mask layer 4 located above the primary trench 3 or 3' that surrounds this island. This excess mask portion 4 is referenced as 40 in FIG. 5D.

Figure 5E:
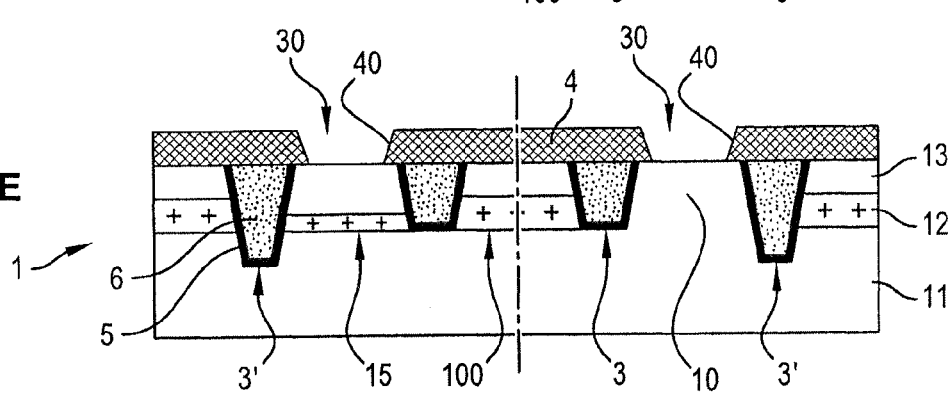

FIG. 5E illustrates the oxide dissolution treatment at the islands 30 not covered by the mask 4. This dissolution treatment is conducted as described earlier.

Figure 5F:
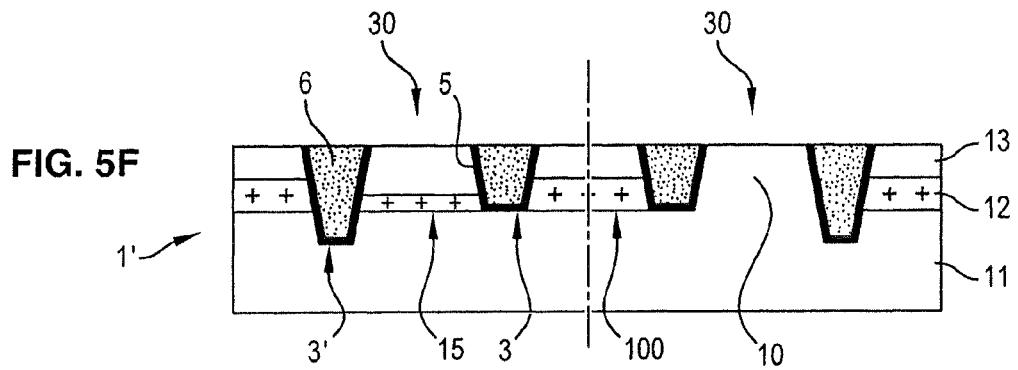

For purposes of simplification, the result obtained after partial dissolution of the oxide (see the SeOI area with a thinned oxide layer referenced as 15) is illustrated on the left half of FIGS. 5E and 5F and on the right half, the one obtained after total dissolution of the oxide (see the bulk area 10). However, during the application of the method, it will be noted that it is only possible to obtain on the same substrate, partial dissolution or else total dissolution of the oxide.

After removing the mask 4, the mixed substrate 1' is obtained, in which the trenches 3 or 3' are filled with a layer 5 of $Si_3N_4$ on the walls and on $SiO_2$ 6, which both form an insulating material, the latter may be preserved during the subsequent performance of the steps for manufacturing the components on this substrate. This substrate is illustrated in FIG. 5F.

It will be noted that with the presence of the portion 40 of the mask 4, it is possible to ensure complete encapsulation of the oxide 6 of the trenches in order to prevent this oxide from being exposed to the atmosphere of the dissolution treatment and from possible detrimental reaction with this atmosphere.

Finally, although this is not illustrated in the figures, it is also possible to form again other series of trenches, so-called "secondary" trenches, inside the bulk areas 10 and the SeOI areas 15 and 100 formed earlier within the scope of the subsequent manufacturing of electronic components.

After dissolution and removal of the mask 4, the standard method for manufacturing components may be continued, the components being formed and their performances adjusted according to needs, on the bulk or "SeOI" areas on which they are positioned.

The invention claimed is:

1. A method for manufacturing at least one of an electronic device, an optical device, and an optoelectronic device, comprising:
   forming a plurality of trenches extending through a thin semiconductor layer and a buried insulator layer of a semiconductor-on-insulator substrate and delimiting at least one island comprising a portion of the thin semiconductor layer and a portion of the buried insulator layer;
   forming a dissolution mask comprising a material deposited within the plurality of trenches and covering at least one area of a free surface of the thin semiconductor layer outside the at least one island; and
   subjecting the semiconductor-on-insulator substrate to a heat treatment to at least partially dissolve the portion of the buried insulator layer in the at least one island and reduce a thickness of the buried insulator layer in the at least one island.

2. The method of claim 1, further comprising at least partially removing the dissolution mask after subjecting the semiconductor-on-insulator substrate to the heat treatment.

3. The method of claim 2, wherein at least partially removing the dissolution mask after subjecting the semiconductor-on-insulator substrate to the heat treatment comprises:
   removing a portion of the dissolution mask covering the at least one area of the free surface of the thin semiconductor layer outside the at least one island; and
   preserving a portion of the dissolution mask within the plurality of trenches.

4. The method of claim 2, further comprising depositing an insulating material in the plurality of trenches after at least partially removing the dissolution mask and while manufacturing at least one component of the at least one of an electronic device, an optical device, and an optoelectronic device.

5. The method of claim 4, wherein subjecting the semiconductor-on-insulator substrate to a heat treatment to at least partially dissolve the portion of the buried insulator layer in the at least one island and reduce a thickness of the buried insulator layer in the at least one island comprises totally dissolving the portion of the buried insulator layer in the at least one island.

6. The method of claim 5, wherein forming the plurality of trenches extending through the thin semiconductor layer and the buried insulator layer of the semiconductor-on-insulator substrate further comprises forming the plurality of trenches to extend partially through a supporting substrate of the semiconductor-on-insulator substrate on a side of the buried insulator layer opposite the thin semiconductor layer.

7. The method of claim 5, wherein subjecting the semiconductor-on-insulator substrate to the heat treatment comprises performing the heat treatment in a neutral or reducing atmosphere comprising less than 10 ppm oxygen and at a temperature between about 1,100° C. and about 1,300° C.

8. The method of claim 7, wherein the thin semiconductor layer of the semiconductor-on-insulator substrate comprises silicon.

9. The method of claim 1, wherein subjecting the semiconductor-on-insulator substrate to a heat treatment to at least partially dissolve the portion of the buried insulator layer in the at least one island and reduce a thickness of the buried insulator layer in the at least one island comprises totally dissolving the portion of the buried insulator layer in the at least one island.

10. The method of claim 1, wherein forming the plurality of trenches extending through the thin semiconductor layer and the buried insulator layer of the semiconductor-on-insulator substrate further comprises forming the plurality of trenches to extend partially through a supporting substrate of the semiconductor-on-insulator substrate on a side of the buried insulator layer opposite the thin semiconductor layer.

11. The method of claim 1, wherein forming the dissolution mask further comprises covering an outer periphery of the at least one island with a portion of the dissolution mask.

12. The method of claim 1, further comprising forming the material of the dissolution mask to comprise silicon nitride or silicon carbide.

13. The method of claim 1, wherein forming the plurality of trenches comprises etching the trenches into the semiconductor-on-insulator substrate through a patterned photolithographic mask.

14. The method of claim 1, wherein subjecting the semiconductor-on-insulator substrate to the heat treatment comprises performing the heat treatment in a neutral or reducing atmosphere comprising less than 10 ppm oxygen and at a temperature between about 1,100° C. and about 1,300° C.

15. The method of claim 1, wherein the thin semiconductor layer of the semiconductor-on-insulator substrate comprises silicon.

16. The method of claim 1, wherein delimiting the at least one island comprises forming the at least one island to have a surface area of between about 4 $\mu m^2$ and about 100 $\mu m^2$.

17. An electronic device, optical device, or optoelectronic device, comprising:
a semiconductor-on-insulator substrate comprising a thin semiconductor layer and a buried insulator layer on a supporting substrate;
a plurality of trenches extending through the thin semiconductor layer and the buried insulator layer and delimiting at least one island comprising a portion of the thin semiconductor layer and a portion of the buried insulator layer, the buried insulator layer being at least partially dissolved within the at least one island.

18. The device of claim 17, further comprising a dissolution mask material within the plurality of trenches.

19. The device of claim 18, wherein the dissolution mask covers at least one area of a free surface of the thin semiconductor layer outside the at least one island.

20. The device of claim 17, wherein the buried insulator layer is partially dissolved within the at least one island, a portion of the buried insulator layer within the at least one island having a thickness less than a thickness of a portion of the buried insulator layer outside the at least one island.

21. The device of claim 17, wherein the plurality of trenches extends partially through the supporting substrate of the semiconductor-on-insulator substrate.

22. The device of claim 17, wherein the thin semiconductor layer of the semiconductor-on-insulator substrate comprises silicon.

23. The device of claim 17, wherein the buried insulator layer is totally dissolved within the at least one island.

24. The device of claim 17, wherein the at least one island has a surface area of between about 4 $\mu m^2$ and about 100 $\mu m^2$.

* * * * *